United States Patent [19]

Phillips

[11] 4,311,390
[45] Jan. 19, 1982

[54] INTERFEROMETRICALLY CONTROLLED STAGE WITH PRECISELY ORTHOGONAL AXES OF MOTION

[75] Inventor: Edward H. Phillips, Mountain View, Calif.

[73] Assignee: Optimetrix Corporation, Mountain View, Calif.

[21] Appl. No.: 198,358

[22] Filed: Oct. 20, 1980

Related U.S. Application Data

[63] Continuation of Ser. No. 15,713, Feb. 27, 1979, abandoned.

[51] Int. Cl.$^3$ .................. G01B 11/00; G01B 11/02
[52] U.S. Cl. .............................. 356/358; 356/363
[58] Field of Search .............................. 356/358, 363

[56] References Cited

U.S. PATENT DOCUMENTS

| | | | |
|---|---|---|---|
| 3,786,332 | 1/1974 | Hepner et al. | 356/363 |
| 3,791,739 | 2/1974 | Kawasaki | 356/363 |
| 3,815,996 | 6/1974 | Colding et al. | 356/363 |
| 3,926,523 | 12/1975 | Chapman | 356/363 |
| 4,053,231 | 10/1977 | Fletcher et al. | 356/363 |

*Primary Examiner*—Alfred E. Smith
*Assistant Examiner*—Janice A. Howell
*Attorney, Agent, or Firm*—Roland I. Griffin

[57] ABSTRACT

A projection lens is mounted between a movable stage and a stationary holder to project an image of a reticle held by the holder onto a semiconductive wafer held by a chuck mounted on the stage. The stage is movable along orthogonal X and Y axes in a horizontal plane to align different regions of the semiconductive wafer with the projected image of the reticle. First and second movable plane mirrors fixedly mounted on the stage for movement therewith are symmetrically disposed relative to the Y axis in first and second vertical planes intersecting one another at the Y axis. Similarly, first and second stationary plane mirrors fixedly mounted on a housing of the projection lens are disposed parallel to the first and second movable mirrors, respectively. As the stage is moved along the X and Y axes, first and second interferometer systems provide first and second measurement signals indicative of the velocities of the first and second movable mirrors (relative to the first and second stationary mirrors) while they are being moved along first and second measurement paths normal to the first and second movable mirrors, respectively. In response to the difference and the sum of these measurement signals, first and second position control circuits move the stage along precisely orthogonal X and Y axes with the Y axis bisecting the angle between the first and second movable mirrors.

40 Claims, 3 Drawing Figures

INTERFEROMETRICALLY CONTROLLED STAGE WITH PRECISELY ORTHOGONAL AXES OF MOTION

CROSS REFERENCE TO RELATED APPLICATION

This is a continuation of application Ser. No. 15,713, filed Feb. 27, 1979, now abandoned.

BACKGROUND AND SUMMARY OF THE INVENTION

This invention relates generally to interferometrically controlled stages movable along X and Y axes for positioning or aligning a first object, such as a photomask or a semiconductive wafer, with respect to a second object, such as a reticle, or an image thereof, and more specifically to an interferometrically controlled stage movable along precisely orthogonal X and Y axes for successively positioning or aligning different regions of a photomask or a semiconductive wafer with respect to the same reticle or an image thereof.

In the semiconductor industry interferometrically controlled stages movable along X and Y axes are employed both in the fabrication of photomasks and in the processing of semiconductive wafers to form integrated circuits and the like. A high (submicron) resolution photomask is typically fabricated by employing such an inteferometrically controlled stage to successively position different regions of the photomask with respect to a reticle, or an image of a reticle, representing a level of microcircuitry to be printed on the photomask at each of those regions. This step-and-repeat printing operation forms an array of adjacent regions of microcircuitry of one level on the photomask in rows and columns parallel to the X and Y axes of motion of the interferometrically controlled stage. A set of such photomasks, each bearing an array of microcircuitry of a different level is typically employed in the fabrication of integrated circuits or the like from a semiconductive wafer. In the course of this fabrication, the semiconductive wafer is sequentially aligned with each photomask of the set and the level of microcircuitry printed on the photomask is in turn printed on the semiconductive wafer. However, it is also possible to eliminate the operation of forming a set of such photomasks by employing an interferometrically controlled stage to successively align different regions of the semiconductive wafer with each of the reticles employed in fabricating the set of photomasks so that the level of microcircuitry represented by each of those reticles may be printed directly on the semiconductive wafer at each of those regions during separate step-and-repeat printing operations.

In order to facilitate the precise positioning or alignment of an array of adjacent regions of one level of microcircuitry being printed on a photomask, or on a semiconductive wafer, relative to each array of adjacent regions of microcircuitry of another level previously printed or yet to be printed on the other photomasks of the same set, or relative to each array of adjacent regions of microcircuitry of another level previously printed or yet to be printed on the semiconductive wafer, it would be highly desirable to employ an interfermeterically controlled stage having precisely orthogonal X and Y axes of motion for step-and-repeat printing operations such as those described above. Unfortunately, however, conventional interferometrically controlled stages do not have precisely orthogonal X and Y axes of motion. Moreover, the degree of nonorthogonality of the X and Y axes of motion of such stages is normally different from stage to stage so that different stages have different frames of reference and cannot therefore be employed interchangeably in printing different levels of microcircuitry on different photomasks of the same set or on the same semiconductive wafer or batch of semiconductive wafers.

Conventional interferometrically controlled stages typically employ a separate interferometer system for each axis of motion of the stage with a first movable mirror of the interferometer system for the X axis of motion being mounted on the stage in a vertical plane normal to the X axis of motion and with a second movable mirror for the Y axis of motion being mounted on the stage in a vertical plane normal to the Y axis of motion, as shown in British Pat. No. 1,196,281 entitled INTERFEROMETRICALLY CONTROLLED POSITIONING APPARATUS and published on June 24, 1970. Since these mirrors must be disposed in vertical planes precisely orthogonal to one another for the stage to have precisely orthogonal X and Y axes of motion, special measurement equipment and procedures involving considerable effort and expense are employed to mount and maintain these mirrors in vertical planes as closely orthogonal to one another as possible. However, since even the best measurement equipment has a finite accuracy, it is in fact not possible to mount and maintain these mirrors in precisely orthogonal vertical planes. As a result the stage does not have precisely orthogonal X and Y axes of motion.

Accordingly, it is the principal object of this invention to provide an interferometrically controlled stage have precisely orthogonal X and Y axes of motion.

Another object of this invention is to provide such a stage while eliminating the effort and expense in attempting to mount the first and second movable mirrors in precisely orthogonal vertical planes.

Still another object of this invention is to provide such a stage which may be employed interchangeably with other such stages in printing different levels of microcircuitry on different photomasks of the same set or on the same semiconductive wafer or batch of semiconductive wafers.

These and other objects are accomplished according to the illustrated preferred embodiment of this invention by employing a stage movable along X and Y axes in a horizontal plane, and by fixedly mounting first and second movable plane mirrors of first and second interferometer systems, respectively, on the stage in vertical planes intersecting one another at the Y axis with the first and second movable mirrors symmetrically disposed about the Y axis. First and second stationary plane mirrors are fixedly mounted above the stage on a housing of a projection lens or some other such utilization device and are disposed parallel to the first and second movable mirrors, respectively. The first interferometer system has a first measurement path normal to the first movable mirror and a first reference path normal to the first stationary mirror. As the stage is moved along either the X or the Y axis, the first interferometer system produces a first measurement signal indicative of the velocity of the first movable mirror while it is being moved (relative to the first stationary mirror) along the first measurement path. Similarly, the second interferometer system has a second measurement path normal to the second movable mirror and a second reference path normal to the second stationary mirror. As the stage is moved along either the X or the Y axis, the second interferometer system produces a second measurement signal indicative of the velocity of the second movable mirror while it is being moved (relative to the second stationary mirror) along the second measurement path. In response to differences and sums of these first and second measurement signals, first and second position control circuits move the stage along precisely orthogonal X and Y axes with the Y axis bisecting the angle between the first and second movable mirrors. Thus, the stage is provided with precisely orthogonal X and Y axes of motion without requiring the first and second movable mirrors to be mounted in precisely orthogonal vertical planes and without requiring any other such unattainable relationship between these mirrors or other parts of the stage. This eliminates the principal source of degradation in the orthogonality of the X and Y axes of motion of the stage. By comparison, other sources of degradation, such as unevenness of the first and second movable mirrors, are insignificant and are therefore disregarded for purposes of this application.

DESCRIPTION OF THE PREFERRED EMBODIMENT

Figure 1:
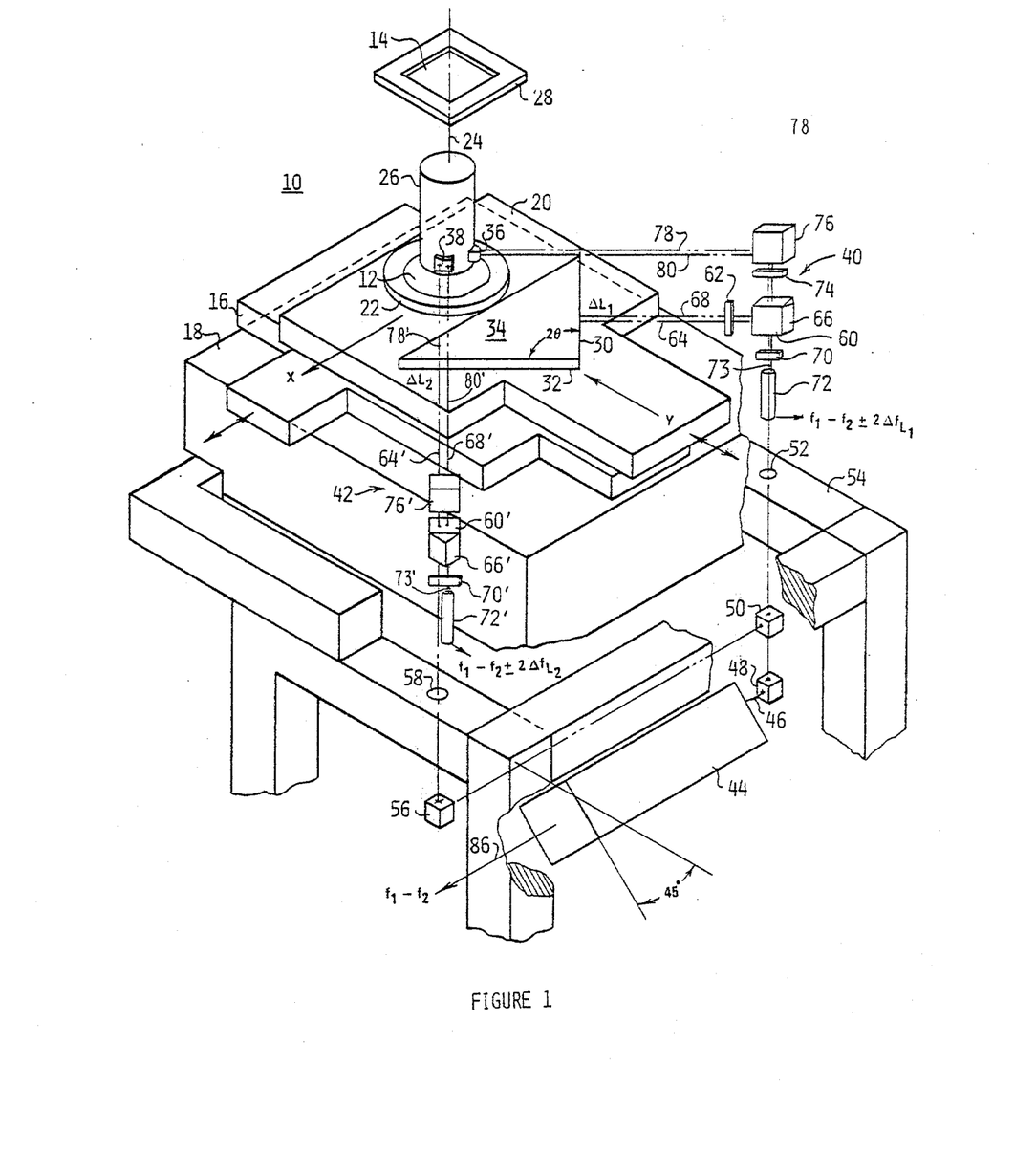
FIG. 1 is a perspective rear view of an interferometrically controlled stage having precisely orthogonal X and Y axes of motion in accordance with the preferred embodiment of the present invention.

Referring now to FIG. 1, there is shown an interferometrically controlled stage 10 for use in aligning a workpiece such as a semiconductive wafer 12 with an object such as a reticle 14 or a projected image of the reticle. The stage 10 comprises a lower platform 16 supported by air bearings on the flat upper surface of a granite block 18 for movement generally along an X axis of the stage, and an upper platform 20 supported by air bearings on the flat upper surface of the granite block 18 (through clearance openings in the lower platform 16) for movement generally along an orthogonal Y axis of the stage. In addition, the upper platform 20 is coupled to the lower platform 16 for movement therewith generally along the X axis of the stage 10. Thus, the upper platform 20 of the stage 10 may be moved in a horizontal plane generally along the orthogonal X and Y axes of the stage and, since such movements may occur simultaneously, may be moved along any straight line in that horizontal plane.

The semiconductive wafer 12 is held by a vacuum chuck 22 mounted on the upper platform 20 for movement therewith. Chuck 22 is positioned beneath a projection lens 26 or some other such utilization device for use in processing the semiconductive wafer 12. The reticle 14 is held by a vacuum holder 28 positioned directly above the projection lens 26 and along an optical axis 24 thereof. Both the projection lens 26 and the holder 28 for the reticle 14 are mounted on a frame attached to the granite block 18. In the process of fabricating integrated circuits or the like from the semiconductive wafer 12, the stage 10 is moved along the X and Y axes to successively align adjacent regions of one level of microcircuitry that may have already been formed on the semiconductive wafer with an image of another level of microcircuitry contained on the reticle 14 and yet to be printed on the semiconductive wafer at each of those regions. This image is projected onto the semiconductive wafer 12 by the projection lens 26.

In order to provide the stage 10 with precisely orthogonal X and Y axes of motion, two elongated plane mirrors 30 and 32 are fixedly mounted on the upper platform 20 for movement therewith. These mirrors (hereinafter being referred to as the first and second movable mirrors 30 and 32) are disposed symmetrically about the Y axis in respective first and second vertical planes intersecting one another at the Y axis at an angle of $2\theta$. No special measurement equipment or critical measurement procedures are required in mounting the first and second movable mirrors 30 and 32 on the upper platform 20 of the stage 10 since, as hereinafter described, the stage is controlled so that the X and Y axes are precisely orthogonal to one another with the Y axis bisecting the angle $2\theta$ between the first and second movable mirrors. The first and second movable mirrors 30 and 32 may therefore be mounted in respective first and second vertical planes intersecting one another at virtually any angle, and, for purposes of illustration, are shown as being fixedly mounted on the upper platform 20 of the stage 10 at a nominal right angle to one another by a carrier 34. First and second plane mirrors 36 and 38 are fixedly mounted on a housing of the projection lens 26 above the carrier 34. These mirrors (hereinafter being referred to as the first and second stationary mirrors 36 and 38) correspond and are disposed parallel to the first and second movable mirrors 30 and 32, respectively.

First and second interferometer systems 40 and 42 are employed to precisely measure the velocities of the first and second movable mirrors 30 and 32 (relative to the first and second stationary mirrors 36 and 38) while they are being moved along corresponding first (or $\Delta L_1$) and second (or $\Delta L_2$) measurement paths normal to the first and second movable mirrors, respectively, as happens whenever the stage 10 is moved along either the X or the Y axis, and to produce measurement signals indicative of those velocities. Interferometer systems such as those manufactured and sold by Hewlett-Packard Company and described in detail in Hewlett-Packard Company's Application Note 197-2 for the 5501 A laser transducer and in U.S. Pat. No. 3,458,259 entitled INTERFEROMETRIC SYSTEM and issued on July 28, 1969, may be employed as the first and second interferometer systems 40 and 42. The interferometer systems 40 and 42 share a two frequency single mode laser transducer 44, such as the Hewlett-Packard 5501 A laser transducer, for emitting a beam of light 46 including a first component having frequency $f_1$ (hereinafter referred to as $f_1$ light) and a second parallel and overlapping component having a frequency $f_2$ (hereinafter referred to as $f_2$ light). These parallel and overlapping components of $f_1$ and $f_2$ light have linear horizontal and vertical polarizations (relative to the laser transducer 44), respectively. A beam bender 48 is employed to deflect the beam of light 46 from the laser transducer 44 upward to a beam splitter 50, which transmits fifty percent of the beam of light upward through an aperture 52 in a frame 54 for holding the block of granite 18. Beam splitter 50 also reflects fifty percent of the beam of light 46 from the laser transducer 44 to another beam bender 56 from which it is in turn deflected upward through an aperture 58 in frame 54.

The laser transducer 44, the beam benders 48 and 56, the beam splitter 50, and the various elements of the first and second interferometer system 40 and 42 hereinafter described may all be mounted on a frame attached to the granite block 18 in the configuration shown. With the first and second movable mirrors 30 and 32 mounted on the carrier 34 at nominally forty-five degrees with respect to the Y axis as shown, the $\Delta L_1$ and the $\Delta L_2$ measurement paths of the first and second interferometer systems 40 and 42, respectively, are rotated nominally forty-five degrees with respect to the Y axis. Thus, with the laser transducer 44 mounted along the X axis as shown, the laser transducer must also be rotated nominally forty-five degrees with respect to the Y axis as shown to orient the polarizations of the $f_1$ light and the $f_2$ light at forty-five degrees with respect to the Y axis and hence parallel and orthogonal to each of the first and second interferometer systems 40 and 42. This is essential since maximum output signal is obtained from the first and second interferometer systems 40 and 42 when those polarizations are so oriented, whereas virtually no output signal can be obtained from the first and second interferometer systems when those polarizations are oriented at forty-five degrees with respect to each of the first and second interferometer systems.

Figure 2:
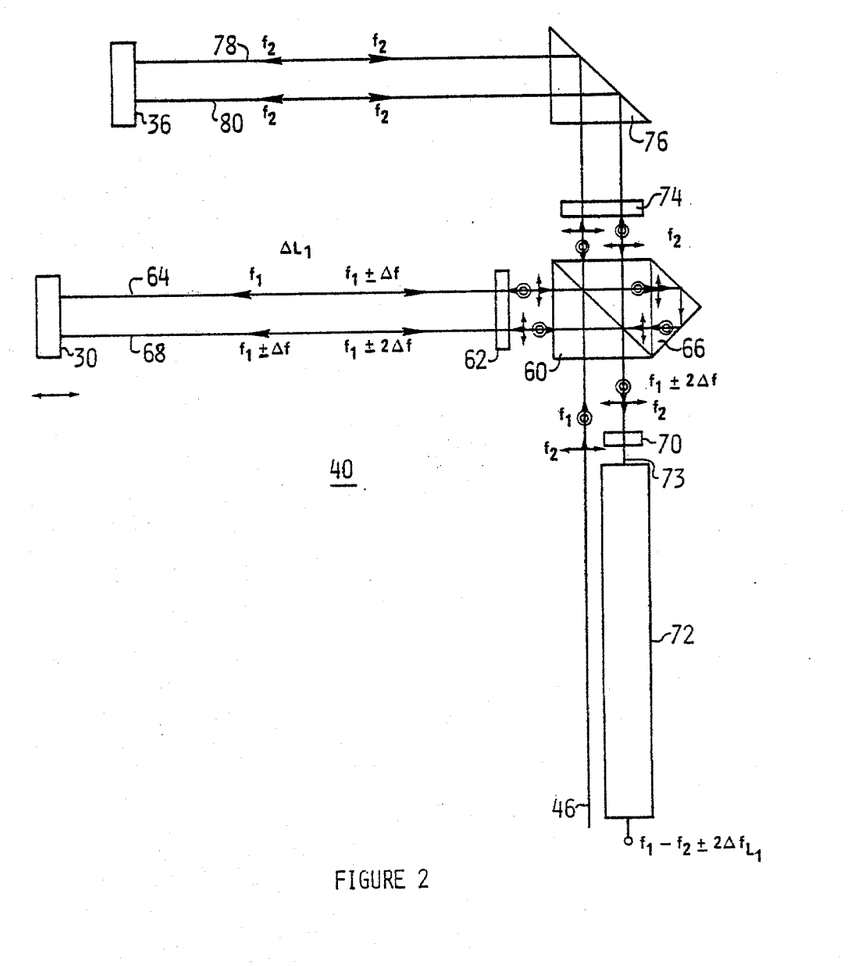
FIG. 2 is a detailed schematic representation of one of the interferometer systems employed with the stage of FIG. 1.

Since the first and second interoferometer systems 40 and 42 are identical, the same reference numbers are generally employed for the same elements of both interferometer systems (with the reference numbers for those of the second interferometer systems being primed), and only the first interferometer system 40 is described in detail. Referring now also to FIG. 2, the first interferometer system 40 includes a polarizing beam splitter 60 for reflecting $f_1$ light of linear horizontal polarization (represented by a double-headed arrow normal to the plane of the paper) passing through the aperture 52 of the frame 54 and for transmitting the $f_2$ light of linear vertical polarization (represented by a double-headed arrow in the plane of the paper) passing through the aperture 52 (an auxiliary arrowhead in the plane of the paper is associated with each double-headed arrow to indicate the direction of propagation of the light). The $f_1$ light reflected by the polarizing beam splitter 60 passes forward through a quarter wave plate 62 to the first movable mirror 30 along a first portion 64 of the $\Delta L_1$ measurement path which, as already described, is normal to the first movable mirror. As the upper platform 20 of the stage 10 is moved along either the X or the Y axis, the corresponding movement of the first movable mirror 30 (relative to the first stationary mirror 36) along the $\Delta L_1$ measurement path causes the $f_1$ light to undergo a frequency change of $\pm \Delta f$ as it is reflected from the first movable mirror backward along the first portion 64 of the $\Delta L_1$ measurement path and through the quarter wave plate 62. The quarter wave plate 62 converts the polarization of the $f_1$ light passing forward therethrough to right-hand circular polarization, which as in turn converted to left-hand circular polarization as the $f_1$ light is reflected from the first movable mirror 30, and converts the polarization of the $f_1 \pm \Delta f$ light reflected backward therethrough to linear vertical polarization. Thus, the $f_1 \pm \Delta f$ light is transmitted by the polarizing beam splitter 60 to an attached retroreflector 66 from which it is reflected forward through the polarizing beam splitter and quarter wave plate 62 to the first movable mirror 30 along a second portion 68 of the $\Delta L_1$ measurement path. The $f_1 \pm \Delta f$ light reflected from the first movable mirror 30 backward along the second portion 68 of the $\Delta L_1$ measurement path undergoes another frequency change of $\pm \Delta f$ as the upper platform 20 of the stage 10 is moved along either the X or the Y axis. In this instance the quarter wave plate 62 converts the polarization of the $f_1 \pm \Delta f$ light passing forward therethrough to left-hand circular polarization, which is in turn converted to right-hand circular polarization as the $f_1 \pm \Delta f$ light is reflected from the first movable mirror 30, and converts the polarization of the $f_1 \pm 2\Delta f$ light reflected backward therethrough to linear horizontal polarization. The $f_1 \pm 2\Delta f$ light reflected backward along the second portion 68 of the $\Delta L_1$ measurement path is therefore reflected by the polarizing beam splitter 60 downward through a mixing polarizer 70 to a photoelectric detector 72.

In a similar manner, the $f_2$ light transmitted by the polarizing beam splitter 60 passes forward through a quarter wave plate 74 to a beam bender 76 from which it is reflected to the first stationary mirror 36 along a portion 78 of a $\Delta L_1$ reference path which, as already described above, is normal to the first stationary mirror (at least from the beam bender 76 forward). This $f_2$ light is reflected from the first stationary mirror 36 backward along the first portion 78 of the $\Delta L_1$ reference path to the beam bender 76 and then through the quarter wave plate 74. The quarter wave plate 74 converts the polarization of the $f_2$ light passing forward therethrough along the first portion 78 of the $\Delta L_1$ reference path to left-hand circular polarization, which is in turn converted to right-hand circular polarization as the $f_2$ light is reflected from the first stationary mirror 36, and converts the polarization of the $f_2$ light reflected backward therethrough along the first portion 78 of the $\Delta L_1$ reference path to linear horizontal polarization. Thus, the $f_2$ light reflected backward from the first stationary mirror 36 along the first portion 78 of the $\Delta L_1$ reference path is reflected by the polarizing beam splitter 60 to the retroreflector 66 from which it is reflected back to the polarizing beam splitter where it is reflected through the quarter wave plate 74 and deflected by the beam bender 76 to the first stationary mirror along a second portion 80 of the $\Delta L_1$ reference path. This $f_2$ light is reflected again from the first stationary mirror 36 backward along the second portion 80 of the $\Delta L_1$ reference path to the beam bender 76 and then through the quarter wave plate 74. The quarter wave plate 74 converts the polarization of the $f_2$ light passing forward therethrough along the second portion of 80 of the $\Delta L_1$ reference path to right-hand circular polarization, which is in turn converted to left-hand circular polarization as the $f_2$ light is reflected again from the first stationary mirror 36, and converts the polarization of the $f_2$ light reflected backward therethrough along the second portion 80 of the $\Delta L_1$ reference path to linear vertical polarization. The $f_2$ light reflected backward along the second portion 80 of the $\Delta L_1$ reference path is therefore transmitted by the polarizing beam splitter 60 downward through the mixing polarizer 70 to the photoelectric detector 72 with the parallel and overlapping $f_1 \pm 2\Delta f$ light from the second portion 68 of the $\Delta L_1$ measurement path in an output beam of light 73. For simplicity of illustration the paths of the input light beam 46 entering the polarizing beam splitter 60 and the output light beam 73 entering the photoelectric detector 72, the first and second portions 64 and 68 of the $\Delta L_1$ measurement path, the first and second portions 78 and 80 of the $\Delta L_1$ reference path, and the retroreflector 66 have been represented as being spatially disposed in the plane of the paper in FIG. 2, whereas they are actually spatially disposed in a plane normal to the plane of the paper as shown in the perspective view of FIG. 1.

Figure 3:
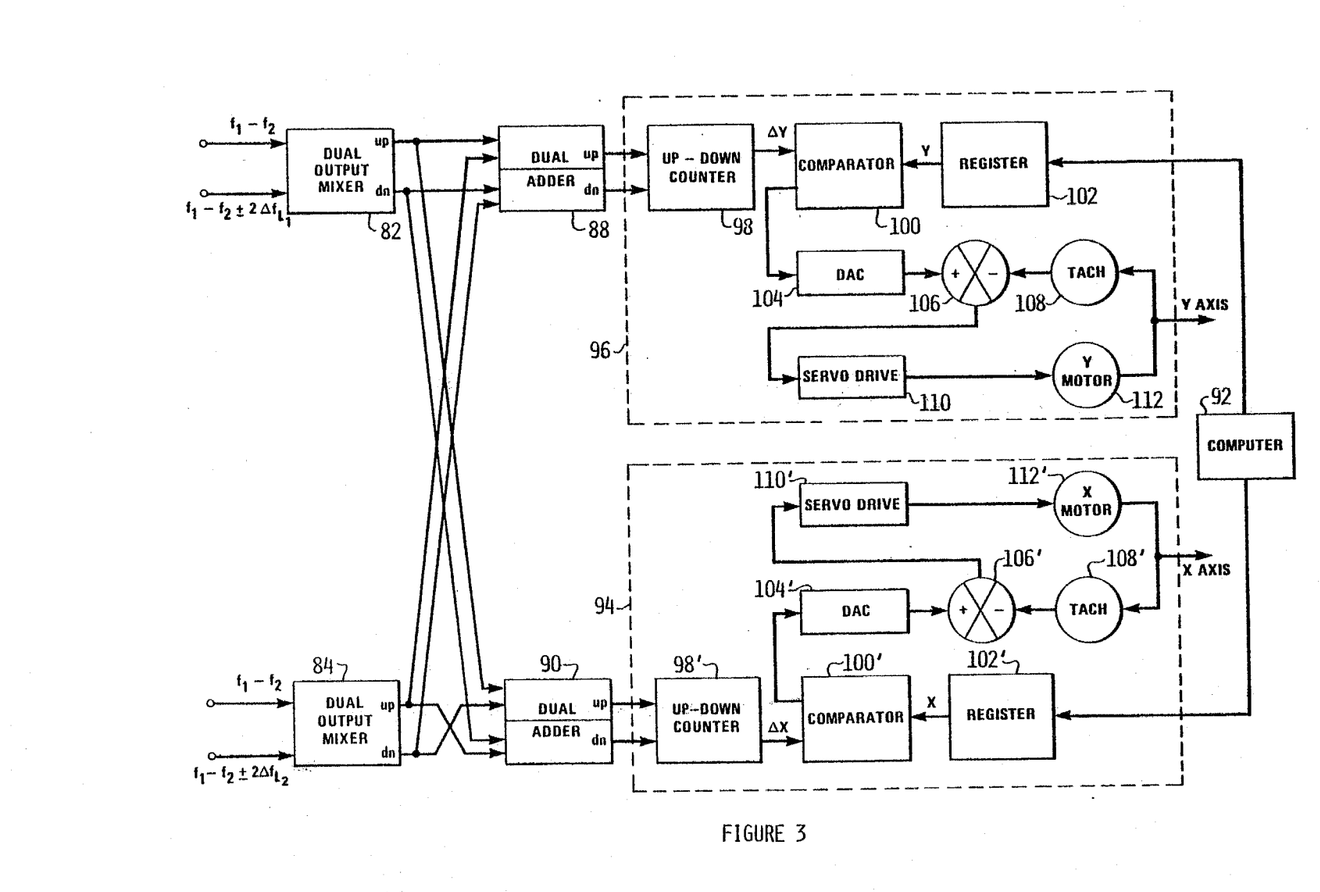
FIG. 3 is a detailed block diagram of the control circuits employed for driving the stage of FIG. 1.

The mixing polarizer 70 mixes the $f_1 \pm 2\Delta f$ light and the parallel and overlapping $f_2$ light of the output light beam 73 passing therethrough to provide each of those components of the output light beam entering the photoelectric detector 72 with a component of similar polarization. These similarly polarized components are mixed by the photoelectric detector 72 to produce a first electrical measurement signal having a frequency $f_1 - f_2 \pm 2\Delta f_{L1}$ at the output of the photoelectric detector. A second electrical measurement signal having a frequency $f_1 - f_2 \pm 2\Delta f_{L2}$ is produced in the same manner as described above by the second interferometer system 42 at the output of the photoelectric detector 72' of that system. Referring now also to FIG. 3, the first electrical measurement signal of frequency $f_1 - f_2 \pm 2\Delta f_{L1}$ is applied to a first input of a first dual output mixer 82 of the first interferometer system 40, and the second electrical measurement signal of frequency $f_1 - f_2 \pm 2\Delta f_{L2}$ is applied to a first input of a second dual output mixer 84 of the second interferometer system 42. An electrical reference signal of frequency $f_1 - f_2$ produced by the laser transducer 44 at an electrical output 86 thereof (see FIG. 1) is applied to a second input of the first dual output mixer 82 and to a second input of the second dual output mixer 84. The first dual output mixer 82 combines the first measurement signal and the reference signal to produce a first pulse train signal having a repetition rate of $2\Delta f_{L1}$ on an up or a down output thereof as determined by whether the sign of the $\pm 2\Delta f_{L1}$ component of the frequency of the first measurement signal is positive or negative, respectively. The repetition rate of this first pulse train signal is proportional to the velocity of the first movable mirror 30 while it is being moved (relative to the first stationary mirror 36) along the $\Delta L_1$ measurement path of the first interferometer system 40, as happens whenever the upper platform 20 of the stage 10 is moved along either the X or the Y axis of motion of the stage. Similarly, the second dual output mixer 84 combines the second measurement signal and the reference signal to produce a second pulse train signal having a repetition rate of $2\Delta f_{L2}$ on an up or a down output thereof as determined by whether the sign of the $\pm 2\Delta f_{L2}$ component of the frequency of the second measurement signal is positive or negative, respectively. The repetition rate of this second pulse train signal is proportional to the velocity of the second movable mirror 32 while it is being moved (relative to the second stationary mirror 38) along the $\Delta L_2$ measurement path of the second interferometer system 42, as also happens whenever the upper platform 20 of the stage 10 is moved along either the X or the Y axis of motion of the stage.

Pulses of the first and second pulse train signals appearing on the up outputs of the first and second dual output mixers 82 and 84 are applied to a first pair of inputs of a first dual adder 88, which produces a pulse train representing the sum of those pulses on an up output of the first dual adder. Similarly, pulses of the first and second pulse train signals appearing on the down outputs of the first and second dual output mixers 82 and 84 are applied to a second pair of inputs of the first dual adder 88, which produces a pulse train representing the sum of those pulses on a down output of the first dual adder. The trains of pulses thereby produced on the up and down outputs of the first dual adder 88 represent the sum of the first and second pulse train signals. Pulses of the first pulse train signal appearing on the up output of the first dual output mixer 82 and pulses of the second pulse train signal appearing on the down output of the second dual output mixer 84 are applied to a first pair of inputs of a second dual adder 90, which produces the sum of those pulses on an up output of the second dual adder. Similarly, pulses of the first pulse train signal appearing on the down output of the first dual output mixer 82 and pulses of the second pulse train signal appearing on the up output of the second dual output mixer 84 are applied to a second pair of inputs of the second dual adder 90. The sums of pulses thereby produced on the up and down outputs of the second dual adder 90 represent the difference of the first and second pulse train signals. In response to the difference and the sum of the first and second pulse train signals and to X and Y digital end point data signals received, for example, from a computer 92, X and Y axes position control circuits 94 and 96 move the upper platform 20 of the stage 10 along precisely orthogonal X and Y axes (with the Y axis bisecting the angle $2\theta$ between the first and second movable mirrors 30 and 32) to precisely position the upper platform 20 as specified by the X and Y digital end point data signals. These movements of the upper platform 20 along precisely orthogonal X and Y axes are effected by the X and Y position control circuits 94 and 96 in accordance with the following equations as hereinafter explained, where $\Delta L_1$ and $\Delta L_2$ are the displacements of the first and second movable mirrors (relative to the first and second stationary mirrors) along the $\Delta L_1$ and $\Delta L_2$ measurement paths of the first and second interferometer system, respectively, as the upper platform is moved along either the X or the Y axis:

$$\Delta X = K_x(\Delta L_1 - \Delta L_2)$$
where $K_x = \frac{1}{2} \cos \theta$; and $$\Delta Y = K_y(\Delta L_1 \pm \Delta L_2)$$
where $K_y = \frac{1}{2} \sin \theta$.

The orthogonality of the $\Delta X$ and $\Delta Y$ movements of the upper platform 20 along the X and Y axes of motion of the stage 10 in accordance with equations (1) and (2) is substantiated by the fact that $\Delta X$ is a function of cosine $\theta$, whereas $\Delta Y$ is a function of sine $\theta$, and by the fact that such cosine and sine terms always exist in quadrature.

Since the X and Y axes position control circuits 94 and 96 are identical, the same reference numbers are employed for the same elements of both position control circuits (with those of the X axis position circuit being primed), and only the Y axis position control circuit is described in detail. Pulses appearing on the up and down outputs of the first adder 88 are applied to an up-down counter 98 for counting those pulses to produce a $\Delta Y$ digital output signal proportional to the sum $(\Delta L_1 + \Delta L_2)$ of the displacements $\Delta L_1$ and $\Delta L_2$ of the first and second movable mirrors 30 and 32 (relative to the first and second stationary mirrors 36 and 38) along the $\Delta L_1$ and $\Delta L_2$ measurement paths of the first and second interferometer systems 40 and 42, respectively, as the upper platform 20 of the stage 10 is moved along either the X or the Y axis of the stage. In effect, the up-down counter 98 integrates the sum of the velocities of the first and second movable mirrors 30 and 32 with respect to time as those velocities are measured by the first and second interferometer systems 40 and 42, respectively, to produce the ΔY digital output signal. This ΔY digital output signal is applied to one input of a comparator 100, and the Y digital end point data signal from the computer 92 is stored in a register 102 and applied to the other input of the comparator. The comparator 100 produces a digital comparison signal equal to the difference between the digital signals applied thereto and proportional to the distance the upper platform 20 must be moved along the Y axis to reach the Y axis position specified by the Y digital end point data signal. This digital comparison signal is applied to a digital-to-analog converter 104 which converts it to an analog voltage signal and applies it to one input of a summing circuit 106. Another analog voltage signal produced by a tachometer 108, as hereinafter explained, is applied to the other input of the summing circuit 106. Thus, the summing circuit 106 produces an output voltage signal equal to the difference between the analog voltage signal from the analog-to-digital converter 104 and the tachometer 108. This output voltage signal is applied to a servo drive circuit 110 for driving a Y axis servo motor 112 mounted on the upper platform 20 and reacting against the lower platform 16 to move the upper platform along the Y axis to the Y axis position specified by the Y digital end point data signal. The tachometer 108 is coupled to the Y axis motor 112 for producing an analog voltage signal proportional to the speed of the Y axis motor and applying it to the summing circuit 106. This reduces the output voltage signal from the summing circuit 106 and therefore slows the Y axis servo motor 112 down as the upper platform 20 approaches the Y axis position specified by the Y digital end point data signal so as to impede the upper platform from overshooting the specified Y axis position.

The up-down counter 98' of the X-axis position control circuit 94 similarly integrates the difference of the velocities of the first and second movable mirrors 30 and 32, as those velocities are measured by the first and second interferometer systems 40 and 42, respectively, to produce a ΔX digital output signal proportional to the difference $(\Delta L_1 - \Delta L_2)$ of the displacements $\Delta L_1$ and $\Delta L_2$ of the first and second movable mirrors (relative to the first and second stationary mirrors 36 and 38) along the $\Delta L_1$ and $\Delta L_2$ measurement paths of the first and second interferometer systems, respectively, while the upper platform 20 of the stage 10 is moved along either the X or the Y axis of the stage. In response to this ΔX digital output signal and an X digital end point data signal stored in the register 102' by the computer 92, the servo drive circuit 110' drives the X axis servo motor 112', which is mounted on the lower platform 16 of the stage 10 and which reacts against the granite block 18, to move the lower platform 16 and, hence, the upper platform 20 to the X axis position specified by the X digital end point data signal. Thus, it may be seen that the upper platform 20 is moved along precisely orthogonal X and Y axis in accordance with the difference $(\Delta L_1 - \Delta L_2)$ and the sum $(\Delta L_1 + \Delta L_2)$ of the displacements of the first and second movable mirrors 30 and 32 (relative to the first and second stationary mirrors 36 and 38) along the $\Delta L_1$ and $\Delta L_2$ measurement paths of the first and second interferometer systems 40 and 42, respectively, as specified by the corresponding terms of equations (1) and (2) above. In actuality the constants $K_x$ and $K_y$ of those equations may be determined without the necessity of precisely measuring or knowing the half angle $\theta$ between the first and second movable mirrors 30 and 32. These constants can be determined in setting up the stage 10 by simply attaching a reference contact member to the upper platform 20; placing a gage block of, for example, four inches in length on the upper platform along the Y axis and in abutment with the reference contact member; mounting a deflection type sensor of an electronic gage at a fixed position (with respect to the upper platform) along the Y axis and in the path of the gage block and the reference contact member; moving the stage forward along the Y axis to bias the gage block against the sensor until the electronic gage is zeroed and then also zeroing the up-down counter 98 of the Y axis position control circuit 96; moving the upper platform backward along the Y axis and removing the gage block; moving the upper platform forward along the Y axis again to bias the reference contact member against the sensor until the electronic gage is zeroed again; dividing the length of the gage block by the count thereupon registered in the up-down counter 98 to determine $K_y$ in inches per count; and by repeating the same process for the X axis with the same reference contact member, the same gage block, and the up-down counter 98' of the X axis position control circuit 94 to determine $K_x$ in inches per count. Since gage blocks are commonly calibrated by the National Bureau of Standards to submicroinch accuracies, this set up procedure permits the upper platform 20 of the stage 10 to be moved along the orthogonal X and Y axes with extremely high precision. The constants $K_x$ and $K_y$, along with other constants such as might be employed to compensate for changes in atmospheric conditions etc., are stored in the computer 92 and utilized in determining a set of pairs of X and Y end point data signals required for a desired step-and-repeat operation. As each pair of X and Y end point data signals is fed by the computer 92 to the registers 102' and 102 of the X and Y axes position control circuits 94 and 96, the upper platform 20 of the stage 10 is successively stepped along precisely orthogonal X and Y axes to the position specified by that pair of X and Y end point data signals so as to successively align adjacent regions of microcircuitry of one level on the semiconductive wafer 12 with the projected image of the reticle 14. Since the upper platform 20 is stepped along precisely orthogonal X and Y axes, other such stages may therefore be employed interchangeably in printing different levels of microcircuitry on the same semiconductive wafer 12.

I claim:

1. A stage movable along orthogonal first and second axes, said stage comprising:

a platform movable nominally along the first and second axes;

first and second reference members mounted on the platform for movement therewith and nominally symmetrically disposed about the first axis in planes intersecting one another nominally at the first axis;

first and second measurement means for producing first and second measurement signals indicative of the movement of the first and second reference members along first and second measurement paths nominally normal to the first and second reference members, respectively, while the platform is being moved along either the first or the second axis; and first and second control means responsive to the sum and the difference of the first and second measurement signals for constraining the platform to move along the orthogonal first and second axes.

2. An interferometrically controlled stage as in claim 1 wherein:
said platform is movable nominally along the first and second axes in a first plane;
said first and second reference members comprise first and second movable mirrors nominally symmetrically disposed about the first axis in second and third planes nominally normal to the first plane and intersecting one another nominally at the first axis;
said first and second measurement means comprise first and second interferometer systems for producing first and second measurement signals indicative of the movement of the first and second movable mirrors along the first and second measurement paths, respectively, while the platform is being moved along either the first or the second axis; and
said first and second control means comprise first and second position control circuits responsive to the sum and the difference of the first and second measurement signals for moving the platform along the orthogonal first and second axes from one position to another with the first axis bisecting the angle between the first and second movable mirrors.

3. An interferometrically controlled stage as in claim 2 wherein:
said first and second interferometer systems produce first and second measurement signals proportional to the velocities of the first and second movable mirrors along the first and second measurement paths, respectively, while the platform is being moved along either the first or the second axis; and
said first and second position control circuits integrate the sum and the difference of the first and second measurement signals with respect to time to produce first and second actual position signals proportional to the sum and the difference, respectively, of the displacements of the first and second movable mirrors along the first and second measurement paths, respectively, and move the platform along the orthogonal first and second axes of the stage as determined by the differences between those first and second actual position signals and first and second desired position signals, respectively.

4. An interferometrically controlled stage as in claim 3 wherein:
said stage includes a chuck mounted on the platform for movement therewith and for holding a workpiece to be successively stepped to different positions with respect to a utilization device; and
said first and second position control circuits are responsive to successive pairs of first and second desired position signals for successively stepping the platform to different positions along the orthogonal first and second axes to successively position different regions of the workpiece with respect to the utilization device.

5. An interferometrically controlled stage as in claim 4 wherein:
said stage includes a granite block;
said platform comprises a first platform mounted for movement on the granite block nominally along the first axis;
said stage includes a second platform mounted for movement on the granite block nominally along the second axis, said first platform being coupled to the second platform for movement therewith along the second axis; and
said first and second position control circuits are coupled to the first and second platforms, respectively, for moving the first platform along the orthogonal first and second axes in response to the sum and the difference of the first and second measurement signals, respectively.

6. An interferometrically controlled stage as in claim 5 including:
first combining means responsive to the first and second measurement signals for applying a signal representative of the sum of those signals to the first position control circuit; and
second combining means responsive to the first and second measurement signals for applying a signal representative of the difference of those signals to the second position control circuit.

7. An interferometrically controlled stage as in claim 6 wherein:
said first position control circuit comprises first counter means, coupled to the first combining means, for integrating the sum of the first and second measurement signals with respect to time to produce a first actual position signal proportional to the sum of the displacements of the first and second movable mirrors along the first and second measurement paths, respectively; first register means for receiving a first desired position signal; first comparator means, coupled to the first counter means and to the first register means, for producing a first comparison signal equal to the difference between the first actual and desired position signals; and first drive means coupled to the first comparator means and to the first platform, for moving the first platform along the first axis to a position designated by the first desired position signal; and
said second position control circuit comprises second counter means, coupled to the second combining means, for integrating the difference of the first and second measurement signals with respect to time to produce a second actual position signal proportional to the difference of the displacements of the first and second movable mirrors along the first and second measurement paths, respectively; second register means for receiving a second desired position signal; second comparator means, coupled to the second counter means and to the second register means, for producing a second comparison signal equal to the difference between the second actual and desired position signals; and second drive means, coupled to the second comparator means and to the second platform, for moving the first platform along the second axis to a position designated by the second desired position signal.

8. An interferometrically controlled stage as in claim 7 wherein:
said first drive means comprises a first motor, coupled to the first platform, for moving the first platform along the first axis; a first summing circuit, coupled to the first comparator means and to a source of signal related to the speed of the first motor, for producing a signal equal to the difference between the first comparison signal and the signal related to the speed of the first motor; and a first servo drive circuit coupled to the first summing circuit and to the first motor, for driving the first motor to move the first platform along the first axis to the position designated by the first desired position signal; and said second drive means comprises a second motor, coupled to the second platform, for moving the first platform along the second axis; a second summing circuit, coupled to the second comparator means and to a source of signal related to the speed of the second motor, for producing a signal equal to the difference between the second comparison signal and the signal related to the speed of the second motor; and a second servo drive circuit, coupled to the second summing circuit and to the second motor, for driving the second motor to move the first platform along the second axis to the position designated by the second desired position signal.

9. An interferometerically controlled stage as in claim 8 wherein:

said first platform is movable along the first and second axes in a horizontal plane; and said first and second movable mirrors are each mounted in a vertical plane.

10. An interferometrically controlled stage as in claim 9 wherein:

a holder is disposed above the first platform for holding a reticle to be imaged onto the workpiece held by the chuck; and a projection lens is disposed between the holder and the first platform for projecting an image of the reticle held by the holder onto the workpiece held by the chuck; and said first and second position control circuits are responsive to successive pairs of first and second desired position signals for successively stepping the first platform to different positions along the orthogonal first and second axes to successively position different regions of the workpiece with respect to the reticle in a stepping operation.

11. An interferometrically controlled stage as in claim 10 wherein:

first and second stationary mirrors are fixedly mounted with respect to the first platform and disposed nominally parallel to the first and second movable mirrors, respectively;

said first interferometer system includes first optical means for directing input light of a first frequency along the first measurement path to the first movable mirror, for directing input light of a second frequency along a reference path to the first stationary mirror, and for combining light reflected at least once from the first stationary mirror and light reflected at least once from the first movable mirror and shifted in frequency, as the first platform is moved along either the first or the second axis, to provide a first output beam of light having a first component of the same frequency as the light reflected at least once from the first movable mirror and a second component of the same frequency as the light reflected at least once from the first stationary mirror; first photoelectric detector means for receiving the first output beam of light and for producing therefrom a first output signal having a frequency equal to the difference in frequency of the first and second components of the first output beam of light; and first mixing means, coupled to the first photoelectric detector means and to a source of signal having a frequency equal to the difference in frequency of the input light of the first frequency and the input light of the second frequency, for producing the first measurement signal; and said second interferometer system includes second optical means for directing input light of a first frequency along the second measurement path to the second movable mirror, for directing input light of a second frequency along a second reference path to the second stationary mirror, and for combining light reflected at least once from the second stationary mirror and light reflected at least once from the second movable mirror and shifted in frequency, as the first platform is moved along either the first or the second axis, to provide a second output beam of light having a first component of the same frequency as the light reflected at least once from the second movable mirror and a second component of the same frequency as the light reflected at least once from the second stationary mirror; second photoelectric detector means for receiving the second output beam of light and for producing therefrom a second output signal having a frequency equal to the difference in frequency of the first and second components of the second output beam of light; and second mixing means, coupled to the second photoelectric detector means and to the source of signal having a frequency equal to the difference in frequency of the input light of the first frequency and the input light of the second frequency, for producing the second measurement signal.

12. A controlled stage comprising:

a platform movable nominally along orthogonal first and second axes in a plane parallel to a plane containing the axes;

measurement means for producing first and second measurement signals respectively indicative of the movement of the platform along first and second measurement paths symmetrically disposed about one of the axes at an angle bisected by said one of the axes and in a plane parallel to the plane of the axes; and control means for constraining the platform to move more precisely along said one and the other of the axes in response to the sum and the difference of the first and second measurement signals.

13. A controlled stage as in claim 12 wherein:

said stage includes first and second movable reference members mounted on the platform for movement therewith;

said first and second movable reference members are symmetrically disposed about said one of the axes in first and second planes intersecting one another at said one of the axes and respectively normal to the first and second measurement paths; and said measurement means produces first and second measurement signals indicative of the movement of the first and second movable reference members along the first and second measurement paths, respectively, while the platform is being moved along either the first or the second axis.

14. A controlled stage as in claim 13 wherein said first and second movable reference members comprise first and second movable reflectors, respectively.

15. A controlled stage as in claim 14 wherein said first and second movable reflectors comprise first and second movable mirrors, respectively.

16. A controlled stage as in claim 15 wherein said first and second movable mirrors are mounted on the platform in nominally orthogonal first and second planes with said one of the axes bisecting the nominal right angle between those planes.

17. A controlled stage as in claim 16 wherein:
said platform is movable along the first and second axes in a horizontal plane; and
said first and second movable mirrors are mounted on the platform in vertical first and second planes.

18. A controlled stage as in claim 15, 16 or 17 wherein:
said measurement means comprises first and second measurement means for producing first and second measurement signals indicative of the movement of the first and second movable mirrors along the first and second measurement paths, respectively, while the platform is being moved along either the first or the second axis; and
said control means comprises first and second position control circuits responsive to the sum and the difference of the first and second measurement signals for moving the platform along said one and said other of the axes from one position to another.

19. A controlled stage as in claim 18 wherein said first and second measurement means comprise first and second interferometer systems, respectively.

20. A controlled stage as in claim 19 including first and second stationary mirrors fixedly mounted with respect to the platform and disposed nominally parallel to the first and second movable mirrors, respectively.

21. A controlled stage as in claim 20 wherein:
said first interferometer system produces a first measurement signal indicative of the movement of the first movable mirror along the first measurement path relative to the first stationary mirror; and
said second interferometer system produces a second measurement signal indicative of the movement of the second movable mirror along the second measurement path relative to the second stationary mirror.

22. A controlled stage as in claim 21 wherein:
said first interferometer system includes first optical means for directing input light of a first frequency along the first measurement path to the first movable mirror, for directing input light of a second frequency along a reference path to the first stationary mirror, and for combining light reflected at least once from the first stationary mirror and light reflected at least once from the first movable mirror and shifted in frequency, as the platform is moved along either the first or the second axis, to provide a first output beam of light having a first component of the same frequency as the light reflected at least once from the first movable mirror and a second component of the same frequency as the light reflected at least once from the first stationary mirror;
said first interferometer system includes first photoelectric detector means for receiving the first output beam of light and for producing therefrom a first output signal having a frequency equal to the difference in frequency of the first and second components of the first output beam of light;
said first interferometer system further includes first mixing means, coupled to the first photoelectric detector means and to a source of signal having a frequency equal to the difference in frequency of the input light of the first frequency and the input light of the second frequency, for producing the first measurement signal;
said second interferometer system includes second optical means for directing input light of a first frequency along the second measurement path to the second movable mirror, for directing input light of a second frequency along a second reference path to the second stationary mirror, and for combining light reflected at least once from the second stationary mirror and light reflected at least once from the second movable mirror and shifted in frequency, as the platform is moved along either the first or the second axis, to provide a second output beam of light having a first component of the same frequency as the light reflected at least once from the second movable mirror and a second component of the same frequency as the light reflected at least once from the second stationary mirror;
said second interferometer system includes second photoelectric detector means for receiving the second output beam of light and for producing therefrom a second output signal having a frequency equal to the difference in frequency of the first and second components of the second output beam of light; and
said second interferometer system further includes second mixing means, coupled to the second photoelectric detector means and to the source of signal having a frequency equal to the difference in frequency of the input light of the first frequency and the input light of the second frequency, for producing the second measurement signal.

23. A controlled stage as in claim 22 wherein:
said first and second interferometer systems produce first and second measurement signals proportional to the velocities of the first and second movable mirrors along the first and second measurement paths, respectively, while the platform is being moved along either the first or the second axis; and
said first and second position control circuits integrate the sum and the difference of the first and second measurement signals with respect to time to produce first and second actual position signals proportional to the sum and the difference, respectively, of the displacements of the first and second movable mirrors along the first and second measurement paths, respectively, and move the platform along said one and said other of the axes as determined by the differences between those first and second actual position signals and first and second desired position signals, respectively.

24. A controlled stage as in claim 12, 13, 14, 15, 16 or 17 including combining means responsive to the first and second measurement signals for applying signals representative of the sum and the difference of those signals to the control means.

25. A controlled stage as in claim 12, 14 or 17 including a chuck mounted on the platform for movement therewith and for holding a workpiece to be successively stepped by the platform to different positions with respect to a utilization device.

26. A controlled stage as in claim 25 wherein:

a holder is disposed for holding a reticle to be imaged onto the workpiece held by the chuck; and said utilization device comprises a projection lens, disposed between the holder and the platform, for projecting an image of the reticle held by the holder onto a different region of the workpiece at each position to which the workpiece is stepped.

27. A controlled stage as in claim 18 including:

first combining means responsive to the first and second measurement signals for applying a signal representative of the sum of those signals to the first position control circuit; and second combining means responsive to the first and second measurement signals for applying a signal representative of the difference of those signals to the second position control circuit.

28. A controlled stage as in claim 27 wherein:

said platform comprises a first platform movable along said one of the axes;

said stage includes a second platform movable along said other of the axes;

said first platform is coupled to the second platform for movement therewith along said other of the axes; and said first and second position control circuits are coupled to the first and second platforms, respectively, for moving the first platform along said one and said other of the axes in response to the sum and the difference of the first and second measurement signals, respectively.

29. A stage as in claim 28 wherein:

said stage includes a base;

said first platform is mounted for movement on the base along said one of the axes; and said second platform is mounted for movement on the base along said other of the axes.

30. A stage as in claim 29 wherein said base comprises a granite block.

31. A stage as in claim 28 wherein:

said first position control circuit includes first counter means, coupled to the first combining means, for integrating the sum of the first and second measurement signals with respect to time to produce a first actual position signal proportional to the sum of the displacements of the first and second movable mirrors along the first and second measurement paths, respectively;

said first position control circuit includes first register means for receiving a first desired position signal;

said first position control circuit includes first comparator means, coupled to the first counter means and to the first register means, for producing a first comparison signal equal to the difference between the first actual and desired position signals;

said first position control circuit further includes first drive means, coupled to the first comparator means and to the first platform, for moving the first platform along said one of the axes to a position designated by the first desired position signal;

said second position control circuit includes second counter means, coupled to the second combining means, for integrating the difference of the first and second measurement signals with respect to time to produce a second actual position signal proportional to the difference of the displacements of the first and second movable mirrors along the first and second measurement paths, respectively;

said second position control circuit includes second register means for receiving a second desired position signal;

said second position control circuit includes second comparator means, coupled to the second counter means and to the second register means, for producing a second comparison signal equal to the difference between the second actual and desired position signals; and said second position control circuit further includes second drive means, coupled to the second comparator means and to the second platform, for moving the first platform along said other of the axes to a position designated by the second desired position signal.

32. A controlled stage as in claim 31 wherein:

said first drive means includes a first motor, coupled to the first platform, for moving the first platform along said one of the axes;

said first drive means includes a first summing circuit, responsive to the first comparator means and to a source of signal related to the speed of the first motor, for producing a signal related to the difference between a desired signal and the signal related to the speed of the first motor;

said first drive means further includes a first servo drive circuit, coupled to the first summing circuit and to the first motor, for driving the first motor to move the first platform along said one of the axes to the position designated by the first desired position signal;

said second drive means includes a second motor, coupled to the second platform, for moving the first platform along said other of the axes;

said second drive means includes a second summing circuit, responsive to the second comparator means and to a source of signal related to the speed of the second motor, for producing a signal related to the difference between a desired signal and the signal related to the speed of the second motor; and said second drive means further includes a second servo drive circuit, coupled to the second summing circuit and to the second motor, for driving the second motor to move the first platform along said other of the axes to the position designated by the second desired position control signal.

33. A controlled stage as in claim 28 including a chuck mounted on the first platform for movement therewith and for holding a workpiece to be successively stepped by the first platform to different positions with respect to a utilization device.

34. A controlled stage as in claim 33 wherein:

a holder is disposed above the first platform for holding a reticle to be imaged onto the workpiece held by the chuck;

said utilization device comprises a projection lens, disposed between the holder and the first platform, for projecting an image of the reticle held by the holder onto the workpiece held by the chuck; and said first and second position control circuits are responsive to successive pairs of first and second desired position signals for successively stepping the first platform to different positions along the orthogonal axes to successively position different regions of the workpiece with respect to the image of the reticle in a stepping operation.

35. A controlled stage as in claim 12, 14 or 17 wherein said platform is controlled for movement along said one and said other of the axes by displacements proportional to the sum and the difference, respectively, of the displacements of the platform along the first and second measurement paths and further proportional to the sine and the cosine, respectively, of one-half the angle between the first and second measurement paths.

36. A controlled stage as in claim 28 wherein said first platform is controlled for movement along said one and said other of the axes in accordance with the following equations:

$$\Delta Y = \tfrac{1}{2} \sin \theta \, (\Delta L_1 + \Delta L_2), \tag{1}$$

and $$\Delta X = \tfrac{1}{2} \cos \theta \, (\Delta L_1 - \Delta L_2), \tag{2}$$

in which $\Delta Y$ represents displacement of the first platform along said one of the axes, $\Delta X$ represents displacement of the first platform along said other of the axes, $\theta$ represents one-half the angle between the first and second measurement paths, $\Delta L_1$ represents displacement of the first platform along the first measurement path, and $\Delta L_2$ represents displacement of the first platform along the second measurement path.

37. A controlled stage as in claim 36 wherein:
said one of the axes is the first axis; and
said other of the axes is the second axis.

38. A method of constraining a movable platform to move along two orthogonal axes in a plane parallel to a plane containing those axes, said method including the step of:
producing first and second signals respectively indicative of the movement of the platform along first and second paths symmetrically disposed about one of the axes at an angle bisected by said one of the axes and in a plane parallel to the plane of the axes; and
driving the platform along said one and the other of the axes in response to the sum and the difference of the first and second signals.

39. A method as in claim 38 wherein the driving step comprises moving the platform along said one and said other of the axes by displacements proportional to the sum and the difference, respectively, of the first and second signals and further proportional to the sine and the cosine, respectively, of one-half the angle between the first and second paths.

40. A method as in claim 39 wherein the driving step further comprises moving the platform along said one and said other of the axes in accordance with the following equations:

$$\Delta U = \tfrac{1}{2} \sin \theta \, (\Delta L_1 + \Delta L_2) \tag{1}$$

and $$\Delta X = \tfrac{1}{2} \cos \theta \, (\Delta L_1 - L_2), \tag{2}$$

in which $\Delta Y$ represents displacement of the platform along said one of the axes, $\Delta X$ represents displacement of the platform along said other of the axes, $\theta$ represents one-half the angle between the first and second measurement paths, $\Delta L_1$ represents displacement of the platform along the first measurement path, and $\Delta L_2$ represents displacement of the platform along the second measurement path.

* * * * *